United States Patent [19]
Nishimura et al.

[11] Patent Number: 5,978,206
[45] Date of Patent: Nov. 2, 1999

[54] STACKED-FRINGE INTEGRATED CIRCUIT CAPACITORS

[75] Inventors: Ken A. Nishimura, Mountain View; Scott D. Willingham, Sunnyvale; William J. McFarland, Redwood City, all of Calif.

[73] Assignee: Hewlett-Packard Company, Palo Alto, Calif.

[21] Appl. No.: 08/940,847

[22] Filed: Sep. 30, 1997

[51] Int. Cl.⁶ ........................... H01G 4/005; H01G 4/228
[52] U.S. Cl. ............................................ 361/303; 361/309
[58] Field of Search ................................. 361/313, 301.1, 361/301.4, 303, 306.1, 306.3, 308.1, 309, 311, 312, 321.2, 329, 330; 257/303, 306

[56] References Cited

U.S. PATENT DOCUMENTS 4,378,620  4/1983  Lavene ................................. 361/323 X
5,745,335  4/1998  Watt ......................................... 361/313

*Primary Examiner*—Dean A. Reichard
*Assistant Examiner*—Anthony Dinkins

[57] ABSTRACT

A capacitor that is adapted for construction over a substrate in the metal interconnect layers provided by conventional integrated circuit processes. The capacitor includes a first conducting layer separated from the substrate by a first dielectric layer and a second conducting layer separated from the first conduction layer by a second dielectric layer. The second conducting layer is divided into a plurality of electrically isolated conductors in an ordered array. Every other one of the conductors is connected to a first terminal, and the remaining conductors are connected to a second terminal. The first conducting layer includes at least one conductor which is connected to the first terminal. In one embodiment of the invention, the first conducting layer also includes a plurality of electrically isolated conductors in an ordered array, every other one of the conductors being connected to the first terminal and the remaining conductors being connected the second terminal.

7 Claims, 5 Drawing Sheets

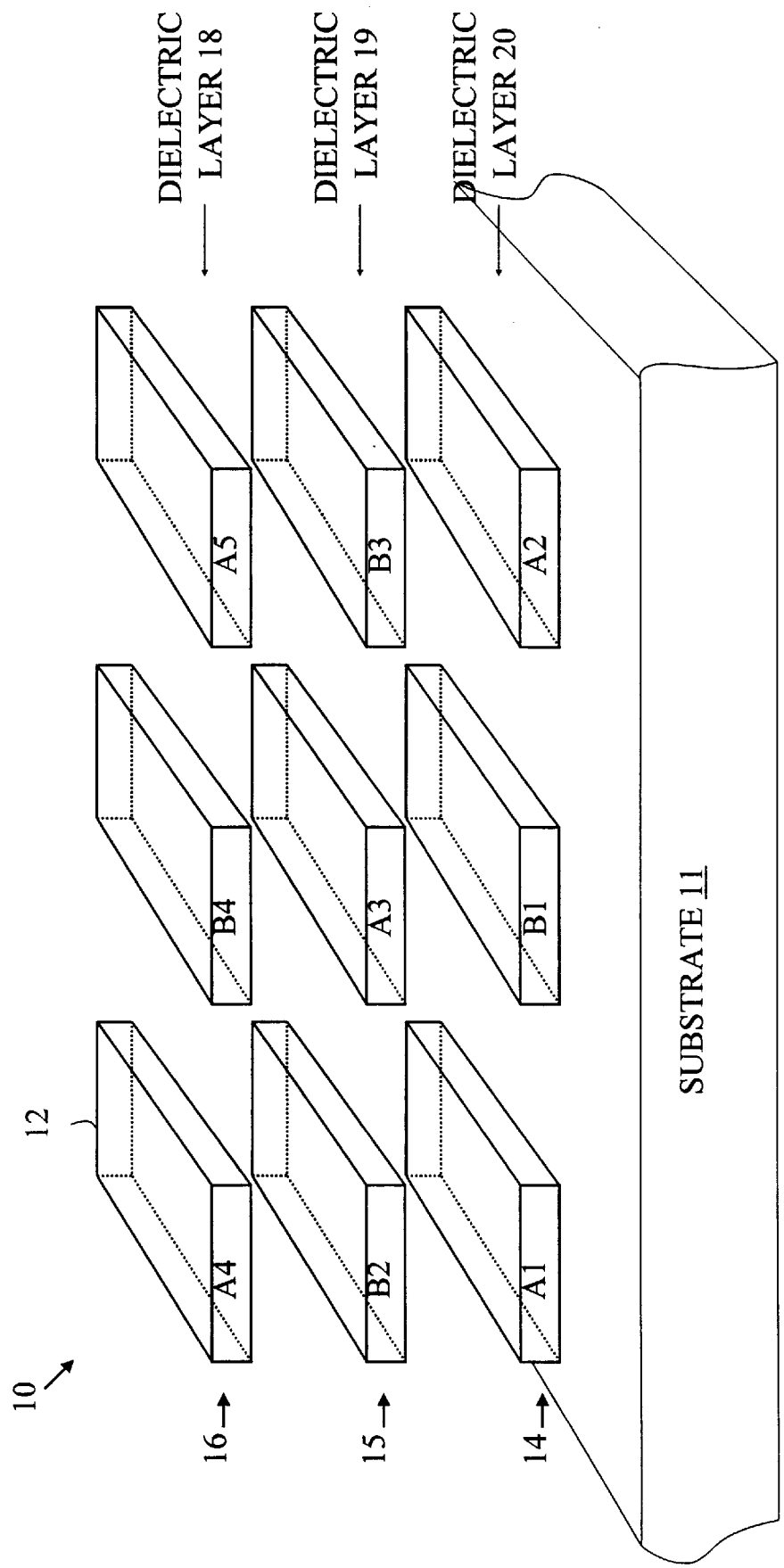

5,978,206

STACKED-FRINGE INTEGRATED CIRCUIT CAPACITORS

FIELD OF THE INVENTION

The present invention relates to integrated circuits, and more particularly, to capacitors for use in integrated circuits.

BACKGROUND OF THE INVENTION

Analog integrated circuits must rely primarily on capacitors to provide reactances, since traditional IC processes do not allow the fabrication of inductances. The limitations imposed by conventional IC processes on capacitors restrict the type of circuits that can be realized using these processes.

Traditional analog IC processes construct capacitors by sandwiching a dielectric layer between conductors. For example, a polysilicon layer deposited over the silicon substrate can serve as the conductors with a layer of gate oxide as the dielectric. Gate oxide layers are very thin, and hence this type of structure has a very high specific capacitance. Unfortunately, the polysilicon layers and terminals deposited thereon form a MOS structure. This leads to a highly non-linear capacitor unless a large DC bias is maintained across the capacitor. Such biases are incompatible with the low power supply voltages used with modern circuits. Further, MOS capacitors are polarized, and hence, cannot be used in circuits such as switched-capacitor circuits in which the terminals of the capacitor are flipped in polarity.

Capacitors may also be constructed using the metal interconnect layers with a dielectric layer between the metal layers to form a metal-metal capacitor. While such capacitors avoid the problems discussed above with respect to MOS capacitors, metal-metal capacitors have two drawbacks of their own. The interlayer dielectrics are relatively thick; hence, metal-metal capacitors have relatively low specific capacitances. Second, such capacitors suffer from parasitic, or "back-plate" capacitance between one, or both, of the terminals and the substrate of the IC. In most processes, the dielectric thickness between the interconnect layers is roughly equal to the dielectric thickness between the substrate and the bottom interconnect layer. Hence, the parasitic capacitance is roughly equal to the active capacitance.

IC processes having a third layer of metal interconnect have become common. In such processes, a stacked plate structure can be used to provide an improved capacitor structure over the metal-metal structure described above. In this case, the capacitor has two dielectric layers sandwiched between the three metal layers. The outer metal layers are electrically connected to form one terminal of the capacitor, while the middle layer forms the other terminal. This doubles the specific capacitance while leaving the parasitic capacitance approximately the same. Hence, such structures have roughly a 2:1 active to parasitic capacitance ratio. While this represents an improvement over the two-layer capacitor construction, there is still a need for an improved capacitor structure.

Broadly, it is the object of the present invention to provide an improved integrated capacitor structure.

It is a further object of the present invention to provide a capacitor structure that has higher active capacitances than obtainable with prior art metal-metal processes.

It is a still further object of the present invention to provide a capacitor structure that has reduced parasitic capacitance on one of its terminals.

These and other objects of the present invention will become apparent to those skilled in the art from the following detailed description of the invention and the accompanying drawings.

SUMMARY OF THE INVENTION

The present invention is a capacitor that is adapted for construction over a substrate in the metal interconnect layers provided by conventional integrated circuit processes. The capacitor includes a first conducting layer separated from the substrate by a first dielectric layer and a second conducting layer separated from the first conducting layer by a second dielectric layer. The second conducting layer is divided into a plurality of electrically isolated conductors in an ordered array. Every other one of the conductors is connected to a first terminal, and the remaining conductors are connected to a second terminal. The first conducting layer includes at least one conductor connected to the first terminal. In one embodiment of the invention, the first conducting layer also includes a plurality of electrically isolated conductors in an ordered array, every other one of the conductors being connected to the first terminal and the remaining conductors being connected the second terminal.

BRIEF DESCRIPTION OF THE DRAWINGS

FIG. 1 is a perspective view of the conductors in a capacitor according to the present invention.

DETAILED DESCRIPTION OF THE INVENTION

Figure 3:
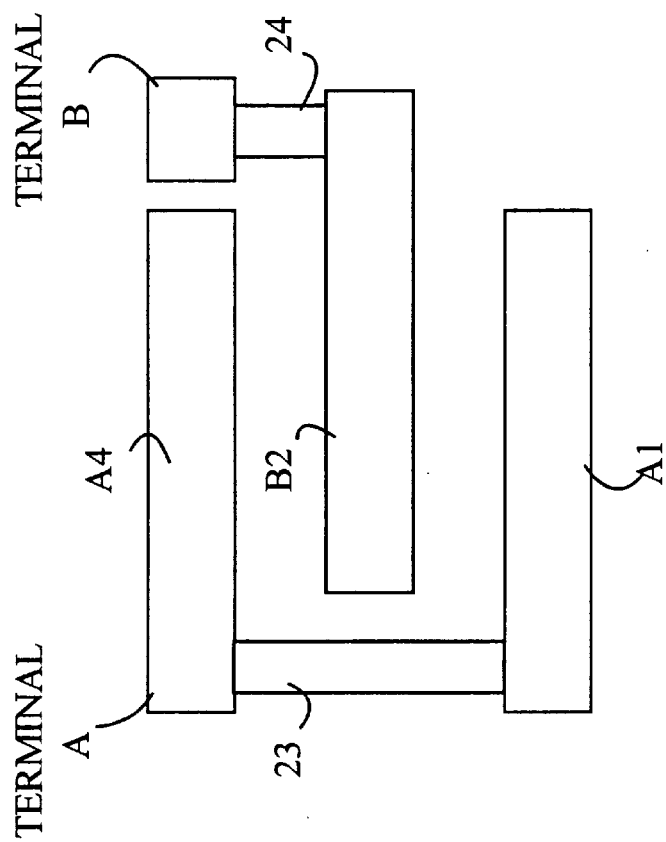
FIG. 3 is a cross-sectional view of the capacitor shown in FIG. 1.

The manner in which the present invention obtains its advantages may be more easily understood with reference to FIG. 1, which is a perspective view of the conductors 12 in a capacitor 10 according to the present invention constructed in a three metal layer process deposited over a substrate 11. The conductors in the first metal layer are shown at 14, those in the second metal layer are shown at 15, and those in the top metal layer are shown at 16. The space between substrate 11 and metal layer 14 is assumed to be filled with a dielectric layer 20. The conductors are connected such that all of the "A" conductors are connected together, and all of the "B" conductors are connected together. To simplify this drawing, the interconnects between the "A" conductors and "B" conductors have been omitted. In addition, the dielectric layers 18 and 19 which fill the space between the metal layers and metal lines in each layer has also been omitted from the drawing.

Figure 2:
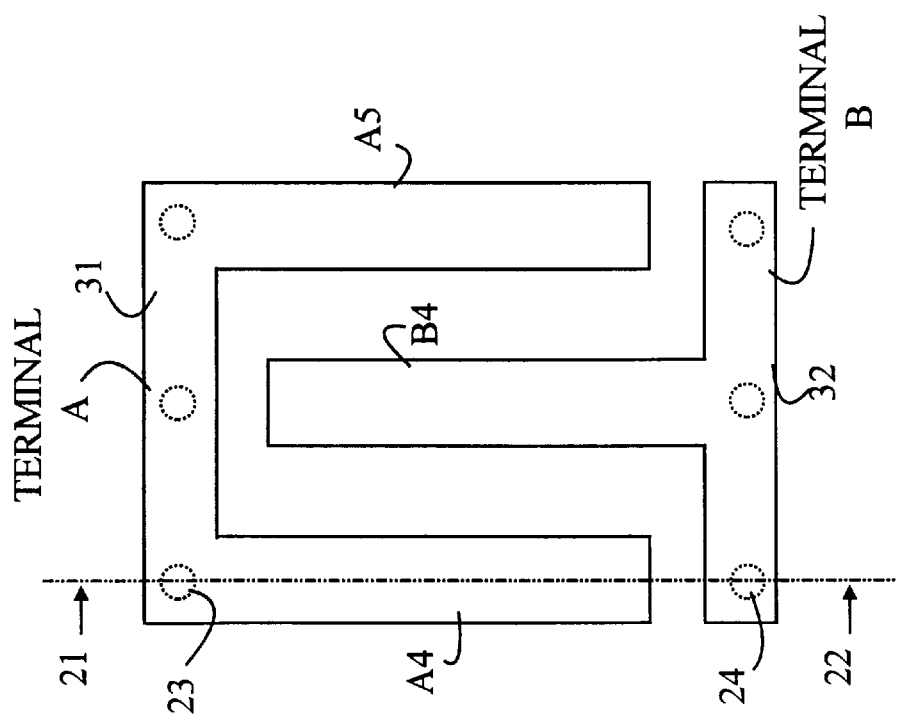
FIG. 2 is a top view of the capacitor shown in FIG. 1.

The interconnections between the A and B conductors may be more easily understood with reference to FIGS. 2 and 3. FIG. 2 is a top view of capacitor 10, and FIG. 3 is cross-sectional view of capacitor 10 through line 21–22. The A conductors are offset from the B conductors such that the conductors in the various layers of the same type may be connected together with the aid of a vertical via. The vias are shown in phantom in FIG. 2. Typical vias are shown at 23 and 24. The A conductors are connected to a first terminal 31, denoted by "terminal A", and the B conductors are connected to a second terminal 32 denoted by "terminal B".

The capacitance between the "A" and "B" conductors results from the conventional parallel plate capacitance between conductors in different levels of metal interconnect and the fringe capacitance between conductors in the same layer of metal. The "A" and "B" conductors are arranged such that each "A" conductor is surrounded by "B" conductors and vice versa within the body of the capacitor. The relative dimensions of metal line width and thickness, and dielectric separation obtained with modern IC processes result in large fringe fields such as between conductors B2 and A3. This fringe capacitance more than overcomes the loss in parallel-plate capacitance due to the gaps in the metal when compared to an equivalent area flat-plate structure.

It is advantageous to minimize the parasitic capacitance between the "A" conductors and substrate 11 and between "B" conductors and substrate 11. Conventional flat-plate capacitors present a parasitic capacitance from the lower metal plate to the substrate due to the parallel-plate capacitance between the substrate and the bottom plate. The embodiment shown in FIG. 1 has a reduced parasitic capacitance because of the gaps between the metal conductors which reduce the plate area of the bottom plate of the parasitic capacitor. In addition, the alternating connection of the metal lines at the lowest level results in the parasitic capacitance being divided equally between the A and B terminals of the capacitor. Finally, the fringing capacitance generated by the edges of the metal lines to the substrate is reduced by the alternating conductor configuration since the B conductors partially shield the A conductors in the bottom layer.

While the example shown in FIG. 1 has only three columns of metal conductors, it is to be understood that the structure can be extended horizontally over the substrate by adding metal conductors to form a structure that is three conductors high and an arbitrary number of conductors wide.

Figure 4:
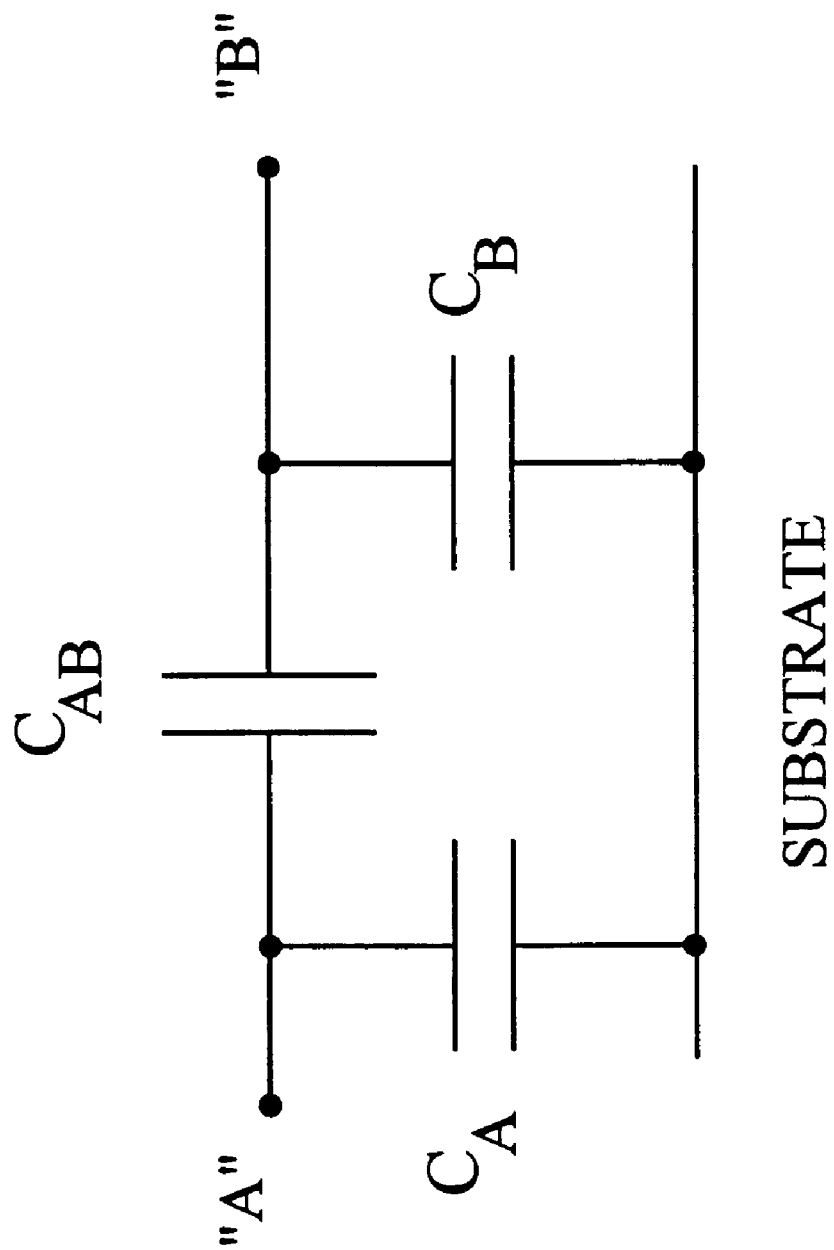
FIG. 4 is a schematic diagram of the equivalent electrical circuit for a capacitor according to the present invention.

The improvement provided by the present invention may be seen by comparing the capacitance of a conventional stacked plate capacitor constructed from three metal plates 100 μm×100 μm, with a capacitor according to the present invention in which each of the plates is divided into conductors to form 42 metal lines having a length of 100 μm. The equivalent circuit of both of the capacitors is shown in FIG. 4. The capacitance between the A and B terminals of the capacitor is denoted by $C_{AB}$. The parasitic capacitance between the A terminal and the substrate is denoted by $C_A$. The parasitic capacitance between the B terminal and the substrate is denoted by $C_B$. For the conventional capacitor, $C_{AB}$ was found to be 750 fF, compared to 1220 fF for the present invention. Hence, the present invention provides higher specific capacitance than the conventional structure. The present invention also provides reduced parasitic capacitance. For the conventional capacitor, $C_A$ and $C_B$ were 280 fF and 5 fF respectively. For the present invention, these values were both 120 fF. Hence, the present invention also provides reduced parasitic capacitance.

Figure 5:
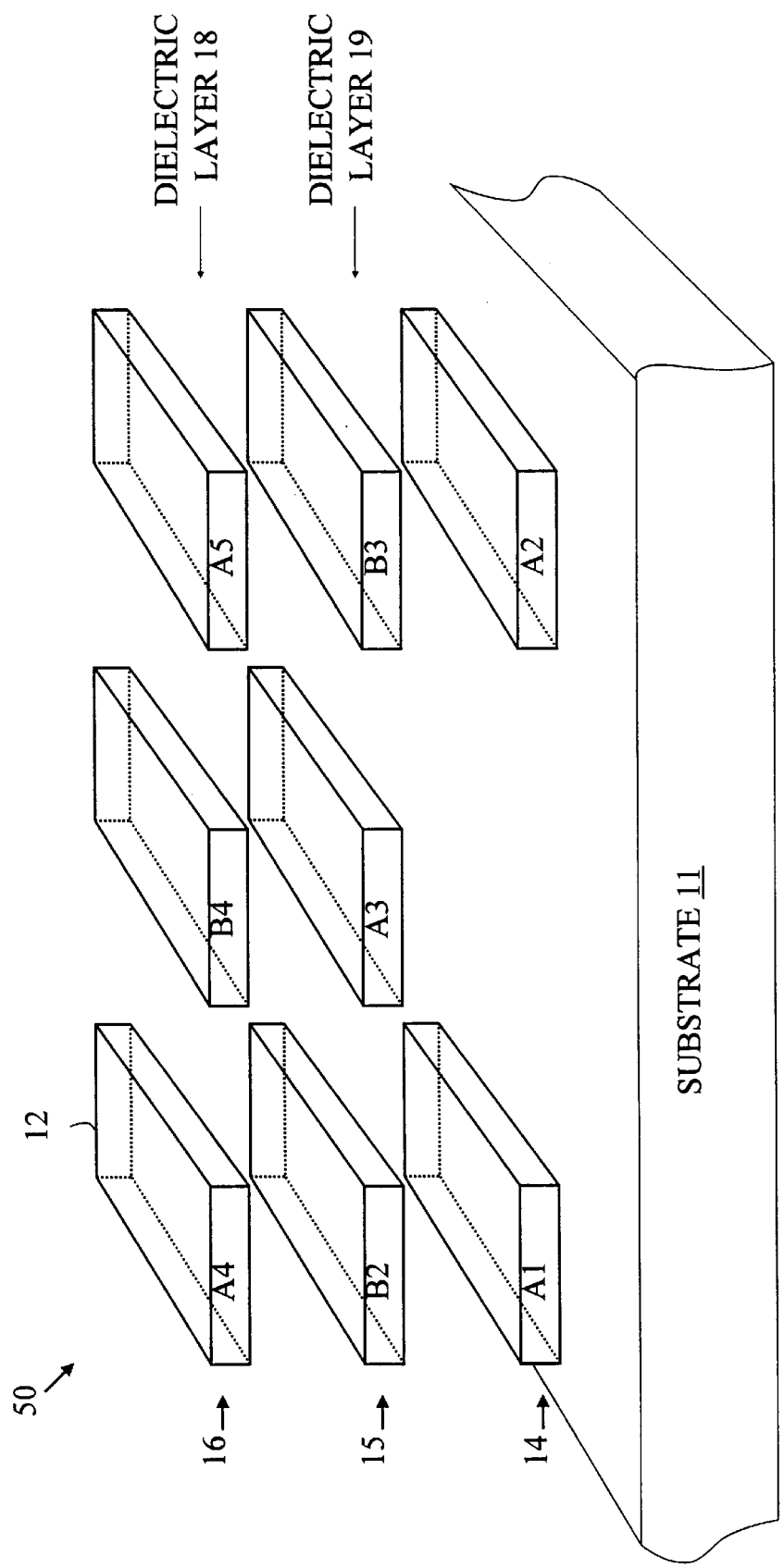
FIG. 5 is a perspective view of the conductors in another embodiment of a capacitor according to the present invention.

In some circumstances, the presence of a parasitic capacitance on one of the terminals of a capacitor is unacceptable. For such cases, the embodiment of the present invention shown in FIG. 1 can be modified by removing the metal lines on the bottom layer corresponding to the terminal in question. For example, all of the B conductors in layer 14 could be eliminated as shown in FIG. 5, which is a prospective view of a capacitor 50 according to the present invention. While this results in a loss of active capacitance, virtually all of the capacitance between terminal B and the substrate is eliminated. In the example discussed above, the removal of all of the B conductors resulted in a drop in $C_{AB}$ from 1220 fF to 907 fF with $C_A$=197 fF and $C_B$=7.5 fF. It should be noted that even with this reduction in active capacitance, the present invention provides significantly more active capacitance and significantly less parasitic capacitance than the conventional stacked plate capacitor.

Figure 6:
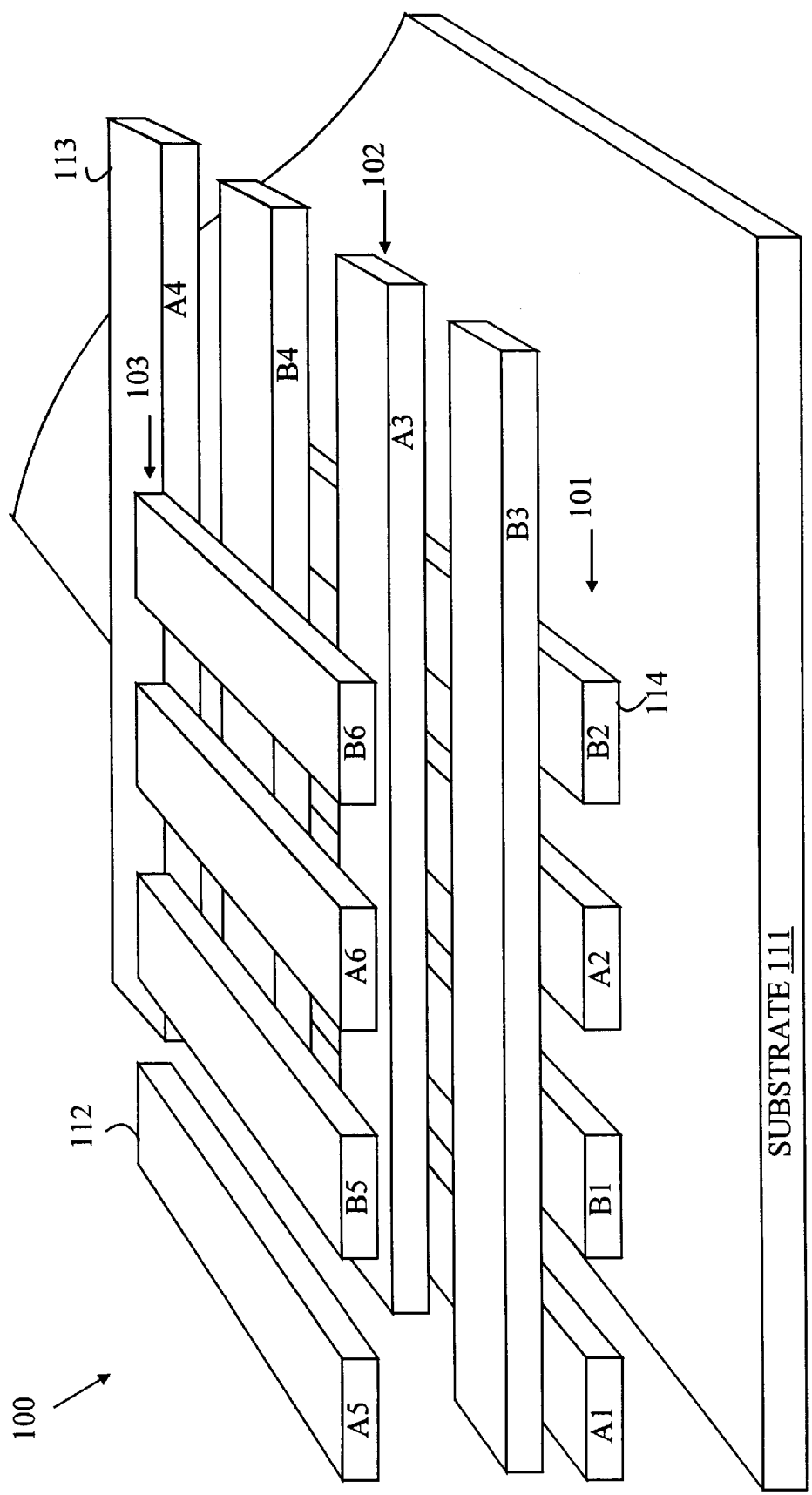
FIG. 6 is a perspective view of the conductors in a third embodiment of a capacitor according to the present invention.

The above-described embodiments of the present invention have utilized a rectangular array of metal strips in which the strips were all parallel to one another. However, embodiments in which the strips are not parallel may also be constructed. Refer now to FIG. 6, which is a perspective view of a capacitor 100 according to the present invention which has been constructed over a substrate 111 utilizing a three-layer metal process. The strips constructed in the first metal layer are shown at 101; a typical strip is shown at 114. The strips constructed in the second metal layer are shown at 102; a typical strip is shown at 113. Finally, the strips constructed in the third metal layer are shown at 103; a typical strip is shown at 112. It will be noted that the strips constructed in the second layer are at right angles to those constructed in the first and third metal layers. The strips are connected such that all of the "A" conductors are connected together, and all of the "B" conductors are connected together. The strips in each layer are arranged such that the conductors alternate between "A" and "B" conductors.

The above-described embodiments of the present invention utilized three layers of conductors because currently available fabrication processes provide three layers of metal interconnect. However, it will be apparent to those skilled in the art from the foregoing discussion that the minimum number of layers is two and that additional layers may be utilized if the integrated circuit processing scheme permits more layers of metal interconnect.

While the above-described embodiments of the present invention have utilized metallic strips in each of the metal layers, it will be apparent to those skilled in the art from the above discussion that other shapes may be utilized. Strips are preferred because of the ease of patterning the strips using conventional lithographic techniques. However, increased capacitance from the fringing field between adjacent conductors in each layer may be obtained by using more complex shapes that provide increased surface area between the adjacent conductors.

Various modifications to the present invention will become apparent to those skilled in the art from the foregoing description and accompanying drawings. Accordingly, the present invention is to be limited solely by the scope of the following claims.

What is claimed is:

1. A capacitor constructed over a substrate, said capacitor comprising:

a first conducting layer separated from said substrate by a first dielectric layer; and a second conducting layer separated from said first conducting layer by a second dielectric layer;

wherein said second conducting layer is divided into a plurality of electrically isolated conductors in an ordered array, every other one of said conductors being connected to a first terminal and the remaining conductors being connected to a second terminal, and wherein said first conducting layer includes at least one conductor which is connected to said first terminal.

2. The capacitor of claim 1 wherein said first conducting layer comprises a plurality of electrically isolated conductors in an ordered array, every other one of said conductors being connected to said first terminal and the remaining conductors being connected to said second terminal.

3. A capacitor constructed over a substrate, said capacitor comprising:

a first conducting layer separated from said substrate by a first dielectric layer; and a second conducting layer separated from said first conducting layer by a second dielectric layer, wherein said second conducting layer is divided into a plurality of electrically isolated conductors in an ordered array, every other one of said conductors being connected to a first terminal and the remaining conductors being connected to a second terminal, and wherein said first conducting layer includes at least one conductor which is connected to said first terminal, and wherein none of said conductors in said first conducting layer is connected to said second terminal.

4. The capacitor of claim 1 wherein said conductors comprise rectangular metallic strips.

5. The capacitor of claim 4 wherein said metallic strips in said first conducting layer are parallel to said metallic strips in said second conducting layer.

6. A capacitor constructed over a substrate, said capacitor comprising:

a first conducting layer separated from said substrate by a first dielectric layer; and a second conducting layer separated from said first conducting layer by a second dielectric layer, wherein said second conducting layer is divided into a plurality of electrically isolated conductors in an ordered array, every other one of said conductors being connected to a first terminal and the remaining conductors being connected to a second terminal, and wherein said first conducting layer includes at least one conductor which is connected to said first terminal, said conductors comprise rectangular metallic strips, and wherein said metallic strips in said first conducting layer are perpendicular to said metallic strips in said second conducting layer.

7. The capacitor of claim 2 wherein the conductors in said second conducting layer that are connected to said first terminal are chosen so as to maximize the capacitance between said first and second terminals.

* * * * *